United States Patent
Yerkovich et al.

[19]

[11] Patent Number: 6,133,787
[45] Date of Patent: Oct. 17, 2000

[54] METHOD AND APPARATUS FOR CONTROLLING THE COMMON MODE IMPEDANCE MISBALANCE OF AN ISOLATED SINGLE-ENDED CIRCUIT

[75] Inventors: Daniel Yerkovich, Seattle; Douglas K. Medema, Everett; Randall J. Makela, Kirkland, all of Wash.

[73] Assignee: Physio-Control Manufacturing Corporation, Redmond, Wash.

[21] Appl. No.: 09/306,644

[22] Filed: May 6, 1999

Related U.S. Application Data

[60] Provisional application No. 60/135,518, May 4, 1999.

[51] Int. Cl.$^7$ ........................................... H03F 1/00
[52] U.S. Cl. .................. 330/68; 330/67; 330/66; 361/816
[58] Field of Search ..................... 330/65, 66, 67, 330/68; 361/800, 816, 817

[56] References Cited

U.S. PATENT DOCUMENTS

| | | | |
|---|---|---|---|
| 3,100,282 | 8/1963 | Fletcher | 330/68 |
| 3,204,201 | 8/1965 | Bahrs | 330/68 |
| 3,629,719 | 12/1971 | Heller et al. | 330/69 |
| 3,725,804 | 4/1973 | Langan | 330/69 |
| 3,832,646 | 8/1974 | Szabó et al. . | |
| 3,972,020 | 7/1976 | Carroll et al. . | |
| 4,086,541 | 4/1978 | Katou et al. | 330/51 |
| 4,634,996 | 1/1987 | Gulczynski | 330/261 |
| 4,709,217 | 11/1987 | Lemaire | 330/258 |
| 4,879,521 | 11/1989 | Bredemann et al. | 330/258 |
| 5,049,831 | 9/1991 | Westwick | 330/107 |
| 5,206,602 | 4/1993 | Baumgartner et al. | 330/9 |
| 5,339,285 | 8/1994 | Straw | 330/258 |
| 5,410,274 | 4/1995 | Birdsall et al. | 330/265 |
| 5,432,476 | 7/1995 | Tran | 330/255 |
| 5,557,238 | 9/1996 | Weiss | 330/285 |
| 5,568,561 | 10/1996 | Whitlock | 330/285 |
| 5,614,864 | 3/1997 | Stubbe et al. | 330/69 |
| 5,625,320 | 4/1997 | Hagerty | 330/2 |
| 5,632,280 | 5/1997 | Leyde et al. . | |
| 5,650,750 | 7/1997 | Leyde et al. | 330/2 |
| 5,760,648 | 6/1998 | Koifman et al. | 330/258 |

*Primary Examiner*—Michael B Shingleton
*Attorney, Agent, or Firm*—Christensen O'Connor Johnson Kindness PLLC

[57] ABSTRACT

A method and apparatus for controlling the common mode impedance misbalance of an isolated single-ended circuit for all common mode paths, thereby allowing the balancing of the common mode impedances which reduces common mode effects while maintaining the advantages of the single-ended amplifier including circuit simplicity and the reference input connected to circuit ground. In one embodiment, two solid shields enclose the circuit as completely as possible with the inner shield connected to circuit ground which is also the reference for all other inputs to the circuit. A discrete capacitor is connected between the outer shield and each of the non-reference inputs. When the shield is complete, i.e., solid, almost solid with minimal holes or a fine mesh, the value of the discrete capacitor is selected to match the parasitic capacitance formed between the outer shield and the inner shield. In another embodiment, the shield may be incomplete, i.e., a grid, coarse mesh or a solid shield only enclosing a portion of the circuit; this shield is connected to the non-reference input of the circuit. In this case, the exposures of the incomplete outer shield and the electronic circuit ground plane (or inner shield) to an external noise source are matched to balance the effect of their parasitic capacitances. Also, in the case of an incomplete shield, a discrete capacitor may be connected between the outer shield and the non-reference input of the circuit to enable balancing the impedances to common mode currents.

26 Claims, 10 Drawing Sheets

METHOD AND APPARATUS FOR CONTROLLING THE COMMON MODE IMPEDANCE MISBALANCE OF AN ISOLATED SINGLE-ENDED CIRCUIT

This nonprovisional application claims the benefit under 35 U.S.C § 119(e) of U.S. Provisional Application No. 60/135,518, filed on May 4, 1999, entitled "METHOD AND APPARATUS FOR CONTROLLING THE COMMON MODE IMPEDANCE MISBALANCE OF AN ISOLATED SINGLE-ENDED CIRCUIT," invented by D. Yerkovich, D. K. Medema and R. J. Makela.

FIELD OF THE INVENTION

The present invention relates to the field of reducing noise in circuitry and, in particular, to reducing common mode noise sensed by an amplifier, such as a single-ended amplifier, by providing at least one shield for the amplifier and coupling a capacitive element between the shield and an input to the amplifier so that a balanced impedance is established between the inputs to the amplifier and any return path for a common mode current.

BACKGROUND OF THE INVENTION

The quality of the output signal generated by an amplifier for amplifying a small signal is highly susceptible to common mode noise because of the high gain required to generate a useful voltage level from the relatively low voltage level of the small signal. For example, if the small signal has a maximum voltage level of 10 milliVolts, the amplifier must provide a 500 times amplification in order to generate a more useful voltage level of 5 Volts for the output signal representing the amplified small signal.

Common mode noise is often the major source of noise in an output signal generated from a small signal presented for amplification at the inputs to an amplifier, e.g., the quality of the output signal of a single-ended preamplifier is highly susceptible to common mode noise. Common mode signals can exist when a circuit contains a loop that allows current to flow from the source of the common mode signals through all signal paths of interest and return to the common mode source via any non-signal path. Common mode signals are typically created by electrical fields or gradients which are coupled into either all signal paths of interest or any other non-signal path in the circuit loop or both. These common mode signals result in common mode currents flowing through the common mode circuit loop. Any impedance misbalance between the signal leads to the common mode current will result in the common mode current generating a differential voltage between the leads with the misbalance. This results in common mode noise artifact appearing along with the signal of interest in the output of the amplifier.

In the prior art, several attempts have been made to solve the problem of eliminating or suppressing the common mode noise presented at the input to an amplifier, so that the output signal generated by the amplifier has a high small signal to common mode noise ratio, i.e., an improved common mode rejection ratio (CMRR). The prior art attempts include the following:

(1) reducing the effect of a varying external electric field by physically moving the source of the small signal away from the electric field;

(2) employing a separate instrumentation amplifier to increase the CMRR by converting a single ended input to the amplifier into a differential input;

(3) electrically isolating the amplifier to increase the CMRR; and (4) improving the CMRR by increasing the differential mode impedance while simultaneously decreasing the common mode impedance by adding additional circuitry which includes active components such as operational amplifiers.

In FIG. 1A, a schematic overview 10 is illustrated of a prior art electronic circuit for amplifying a small signal with a single-ended, non-isolated amplifier. An end of a common mode noise source 18 is coupled by a parasitic capacitance 15 to earth ground and another end of the noise source is coupled to a small signal source 16. The small signal source 16 is coupled through its source impedance elements (represented by a resistor 22 and a resistor 24) to an input of a single-ended amplifier 12 as well as the reference for the amplifier. The non-isolated power supply (not shown) of the amplifier is coupled to both earth and circuit ground. The impedance to the common mode current is misbalanced in the signal leads. This results in almost all of the common mode current flowing through the resistor 24 creating different voltage drops across resistors 22 and 24. The difference in the voltage drops adds to the signal source 16 and thus creates an artifact in the output signal. Since the reference for the amplifier is circuit ground, no common mode voltage is present at the input of the amplifier as in FIGS. 1B & 1C below.

FIG. 1B is a schematic overview 26 that illustrates a prior art differential amplification circuit that uses two (non-inverting and inverting) inputs to connect to the signal source 16 and make the noise source 15 common to both inputs. A signal source 16 is coupled to both inputs of amplifier 20 through its source impedance elements (represented by resistors 22 and 24). The common mode noise source 18 is coupled by the parasitic capacitance to earth ground. The noise source 18, in effect, also couples to the small signal source 16 and is present at both inputs of the amplifier. Also, the non-isolated power supply (not shown) of the amplifier is coupled to both earth and a circuit ground.

Although the prior art circuit in FIG. 1B improves the CMRR, it only provides a relatively small common mode impedance and this circuit allows the common mode voltage signal to be impressed across both inputs to the amplifier. When the common mode voltage signal is greater than the supply rails of the amplifier, the amplifier will saturate and not amplify the small signal impressed across its inputs.

In FIG. 1C, a schematic overview 30 illustrates a prior art differential amplification circuit substantially similar to the circuit shown in FIG. 1B. In this case, an isolated power supply (not shown) is used to energize the amplifier 20. A parasitic capacitance (represented by a capacitor 28) is created by the proximity of the device's ground plane to earth. Although the common mode current is lowered due to the increase in common mode impedance, the common mode signal is still present on all the inputs to the amplifier at least partly because there is both a connection to earth ground through the capacitor 28 and another connection to circuit ground. As with the circuit shown in FIG. 1B, these common mode signals may exceed the common mode input range of the amplifier leading to errors in the output. However, the circuit functions correctly at higher common mode signal levels than that shown in FIG. 1B. A disadvantage of this prior art circuit is that since both inputs are floating with respect to circuit ground, neither input can be effectively used as an external reference for such features as a serial output.

FIG. 1D illustrates a schematic overview 32 of a prior art amplification circuit substantially similar to the circuit shown in FIG. 1A. However, in this case, the amplifier 12 is energized by an isolated power supply (not shown) as in FIG. 1C. A parasitic capacitance (represented by a capacitor 28) is created by the proximity of the device's ground plane to earth and the common mode current is lowered due to the increase in common mode impedance. However, as in FIG. 1A, the impedance to the common mode current is misbalanced in the signal leads. This results in almost all of the common mode current flowing through the resistor 24 creating different voltage drops across resistors 22 and 24. The difference in the voltage drops adds to the signal source 16 and thus creates an artifact in the output signal. Also, since the reference for the amplifier is circuit ground, no common mode voltage is present at the input of the amplifier as it is in FIGS. 1B & 1C.

The present invention allows the use of the configuration shown in FIG. 1D with its attendant advantages, but removes the problem of misbalanced impedances to common mode currents in the signal leads. It does this by enclosing the electronic circuitry with two shields—an inner shield connected to circuit ground and the reference input, and an outer shield which is coupled to all other signal inputs through impedance elements. These impedance elements are typically capacitors whose value is chosen to match the capacitance formed between the inner and outer shields. This results in all signals having a balanced impedance to the common mode current which in turn results in the common mode current being balanced for all signals. Thus no conversion of common mode to differential mode takes place. In this way, the present invention enables a small signal of interest to be amplified to a usable voltage level without generating an output signal that also includes a relatively large component of common mode noise.

SUMMARY OF THE INVENTION

The present invention is an apparatus, system and method for reducing the effect of an external noise source on circuitry that includes an amplifier. One embodiment provides for balancing the impedance presented between each input to the amplifier and any return path for a common mode current created in the circuitry by the external noise source, comprising: (1) a complete shield manufactured from a conductive material and that may enclose at least a portion of the amplifier in the circuit; (2) a ground plane for the circuitry that may be coupled to an input of the amplifier; and (3) a capacitor that may be coupled between another input of the amplifier and the complete shield, the value of the capacitor is selected to match the amount of parasitic capacitance created between the complete shield and the ground plane of the circuitry.

The capacitor may be a discrete capacitive component. Also, the capacitor may be formed by a planar sheet that is manufactured from a conductive material and disposed adjacent to a dielectric material that is itself positioned adjacent to the complete shield. The size and position of the planar sheet is selected to create a capacitance that has a value matching the parasitic capacitance formed between the complete shield and the ground plane of the circuitry. It is also envisioned that a matching resistor could be coupled in series with the capacitor between the shield and the other shield. In this case, if the capacitor has failed in a closed position, the matching resistor will continue balancing the impedance to common mode signals, albeit at a reduced performance compared to that achieved with the capacitor and resistor combination. Additionally, the amplifier included in the circuitry may be a preamplifier.

In another embodiment, a housing may be provided to enclose the circuitry. The housing would be manufactured from a non-conductive material. The complete shield may be disposed within the interior of the housing or it may be positioned on the exterior surface of the housing. When the capacitor is formed by a planar sheet of conductive material, it may be disposed adjacent to an interior surface of the housing. Also, the size and position of the planar sheet would be selected to create a capacitance value that matches the parasitic capacitance formed between the complete shield and the ground plane of the circuitry.

It is envisioned that the complete shield may include a port to provide access to a component of the circuitry. Also, the complete shield may be manufactured from a fine mesh of conductive material. Further, the complete shield may include a portion that is manufactured from a solid layer of conductive material.

In yet another embodiment, the complete shield may enclose another shield that covers at least a portion of the amplifier in the circuitry. The other shield may be coupled to the ground plane of the circuitry and it may be electrically isolated from other components in the circuitry. It is envisioned that the other shield may be manufactured from a fine mesh or a solid layer of conductive material.

Another embodiment of the invention provides for reducing the effect of a common mode noise source on circuitry that includes an amplifier by balancing the impedance presented between each input to the amplifier and any return path for a common mode noise current in the circuitry, comprising: (1) a ground plane for the circuitry may be coupled to an input of the amplifier; (2) a shield could enclose at least a portion of the circuitry, the size and disposition of the shield would be selected to balance the exposure of each input of the amplifier to the external noise source; and (3) a capacitor could be coupled between the shield and each input to the amplifier that is not coupled to the ground plane of the circuitry, the value of the capacitor would be selected to balance the impedance between each input and a common mode current created by a parasitic capacitance in the circuitry.

The capacitor may be formed by positioning a layer manufactured from an electrically conductive material in close proximity to the shield. The layer would be electrically isolated from the shield by another layer manufactured from a dielectric material. The size and the position of the layer would be selected to create a determined capacitive value. Additionally, the amplifier may be electrically isolated from other components in the circuitry.

At least a portion of the shield may be a coarse mesh manufactured from a conductive material. Also, another portion of the shield may be a solid layer that is manufactured from a conductive material.

Another embodiment that provides for reducing the effect of an external noise source on circuitry that includes an amplifier, comprising: (1) a mesh layer manufactured from a conductive material and which encloses at least a portion of the circuitry; (2) another mesh layer manufactured from a conductive material that encloses the mesh layer and at least the portion of the circuitry; and (3) an insulating layer manufactured from a dielectric material that is disposed between the mesh layer and the other mesh layer and provides an electrical isolation between the mesh layer and the other mesh layer, so that a size and a shape of the mesh layer, the insulating layer and the other mesh layer will form a sandwich that balances the exposure of each mesh layer to the external noise source.

One input of the amplifier may be coupled to the mesh layer and the other mesh layer may be coupled to every other input of the amplifier. A ground plane for the circuitry may be coupled to the mesh layer and a capacitor may be coupled between the other mesh layer and each input of the amplifier. Alternatively, one input of the amplifier may be coupled to the other mesh layer and the mesh layer may be coupled to every other input of the amplifier. In this case, a ground plane for the circuitry may be coupled to the other mesh layer and a capacitor may be coupled between the mesh layer and each input of the amplifier. Additionally, the amplifier may be electrically insulated from other components in the circuitry. It is also envisioned that a port could pass through the sandwich formed by the mesh layer, insulating layer and the other mesh layer to provide access to a component of the circuitry.

Another embodiment may employ the present invention with a high voltage circuit such as a defibrillator circuit. The amplifier may employed to sense a small signal, e.g., an electrocardiogram signal, until it is determined to discharge a waveform from the defibrillation circuit to a patient. It is envisioned that a surge protector may be coupled in series with a resistor or alone between an outer shield and an inner shield which is connected to the ground plane of the circuitry. The surge protector and the resistor may be used to clamp the voltage on the shield during the discharge of the defibrillator. The value of the resistor would be selected to limit the amount of in-rush current that can flow through the surge protector. In one embodiment, the surge protector may be a "gas gap" device rated for a maximum of 90 Volts and the resistor may have a value of 4000 ohms. In this embodiment, the outer shield may be constructed to withstand maximum voltages somewhat higher than the rating of the surge protector, e.g., 90 Volts, instead of the voltage rating of the defibrillator circuit which can be as high as 5,000 Volts. Additionally, the resistor and the surge protector may also be coupled in series between the ground plane of the circuitry and a shield disposed in any of the embodiments presented above.

It is also envisioned that another connection may be made between the outermost shield and a small signal source. This connection may provide a lower impedance path for a common mode current and thus lessen the possibility of a common mode to differential mode conversion. Additionally, it is appreciated that the present invention may be used with other circuitry that includes other electronic circuits, e.g., an A/D converter.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION OF THE PREFERRED EMBODIMENT

The present invention provides a method for balancing the impedance to common mode current in the signal leads coming from a signal source. By providing for inner and outer shields around an electronic circuit and adding impedance between the outer shield and those signal leads not used for a reference by the circuit, it is possible to balance the impedance to the common mode current for all signal leads. This balanced impedance to common mode currents results in balanced common mode currents in all signal leads which in turn results in no conversion of common mode signals to differential mode signals at the inputs to the electronic circuitry. This has the effect of improving the common mode rejection ratio (CMRR) of an amplification circuit, but does not depend on any characteristics of the amplifier or associated circuitry to accomplish this.

The following descriptions of the invention describe the invention in terms of solid and grid shields. A solid shield is a shield made up of a continuous piece of conductive material with a minimum number of breaks or holes in the conductive material such as where the inputs enter the shield. A grid shield is effectively a solid shield with large breaks or holes in the conductive layer. The effect is electric fields can "penetrate" the grid shield but not the solid shield. Both a solid or grid shield can be replaced by a mesh shield which is typically made up of woven conductive elements. If the weave is very tight (i.e., very small or no holes in the weave), than the mesh shield will work similar to the solid shield. If the weave is very loose (i.e., large holes in the weave), the mesh shield will work similar to a grid shield. The use of a mesh shield is optional in the following descriptions with the understanding that the proper type of mesh material must be used to replace either the solid or grid shields.

The present invention requires that the shielded circuitry be isolated from earth ground. Two of the ways this can be implemented are by isolating the complete device which contains the shielded circuitry, or by using an isolation barrier between the circuitry which is not isolated from earth ground and the shielded circuitry. The second implementation requires isolated power supplies and data transfer circuitry. The present invention can be used with either implementation.

Figure 1A:
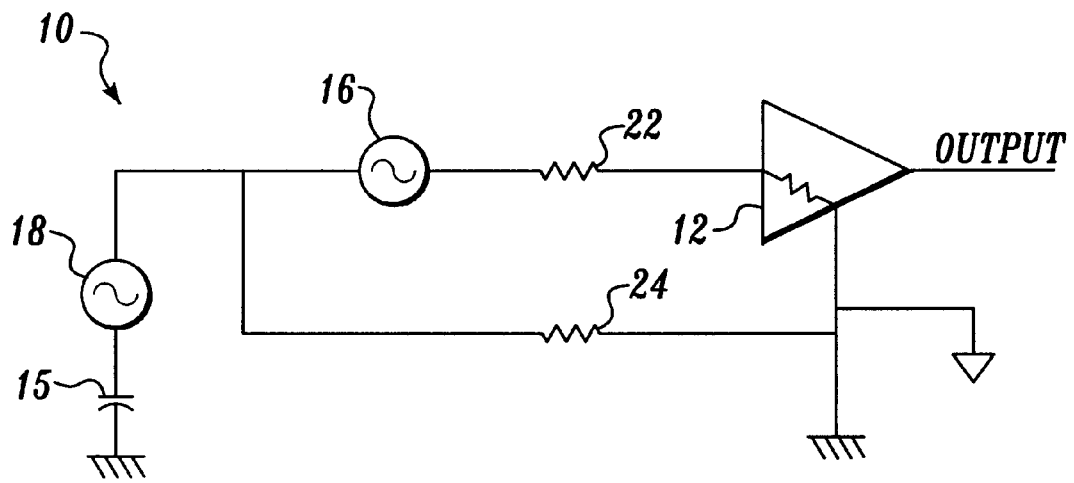
FIGS. 1A–1D illustrate the prior art attempts to reduce common mode noise sensed by an amplification circuit.
Figure 1B:
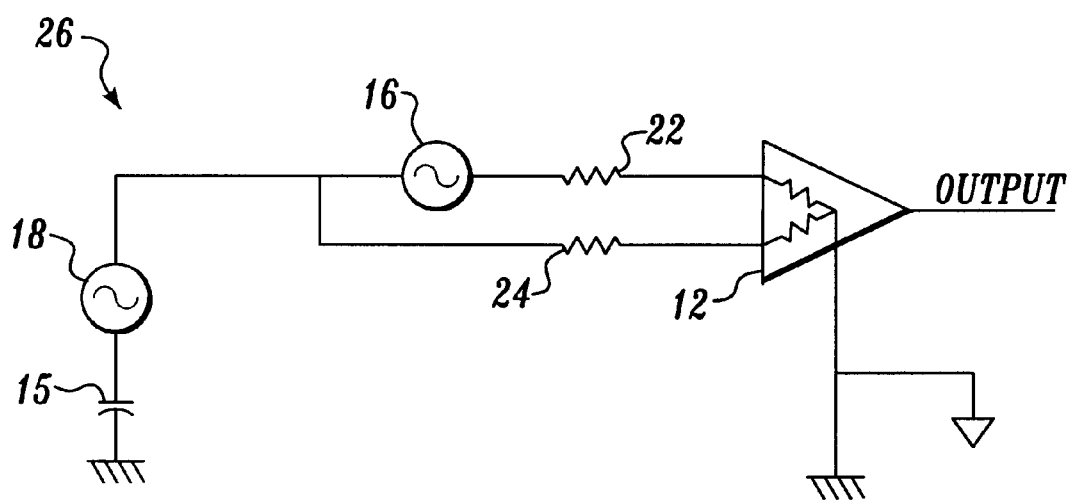
Figure 1C:
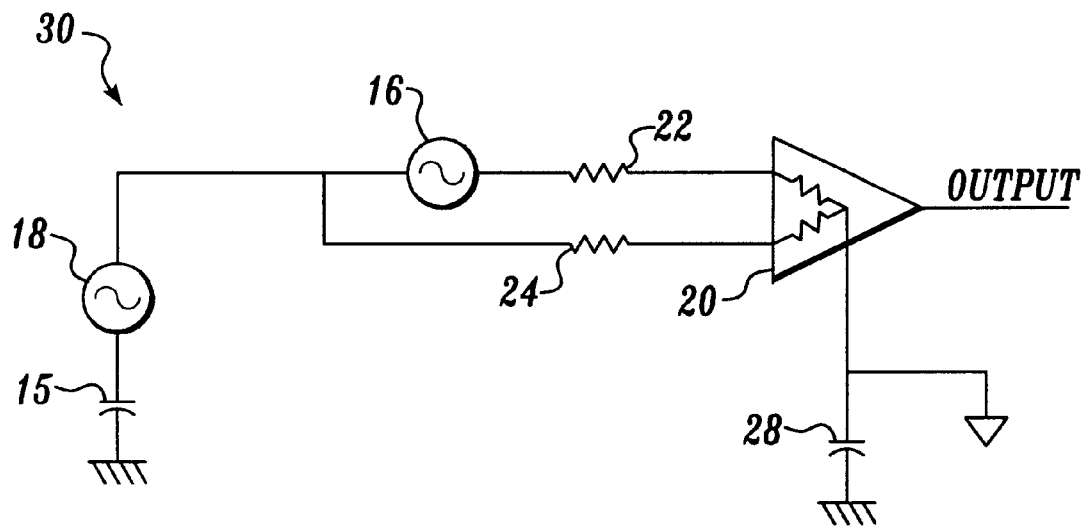
Figure 1D:
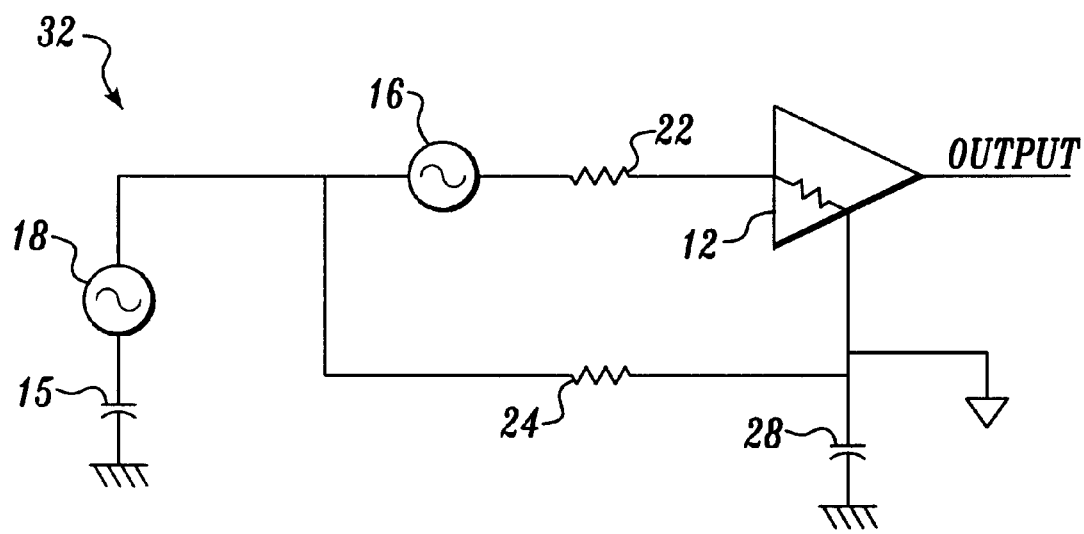
Figure 2A:
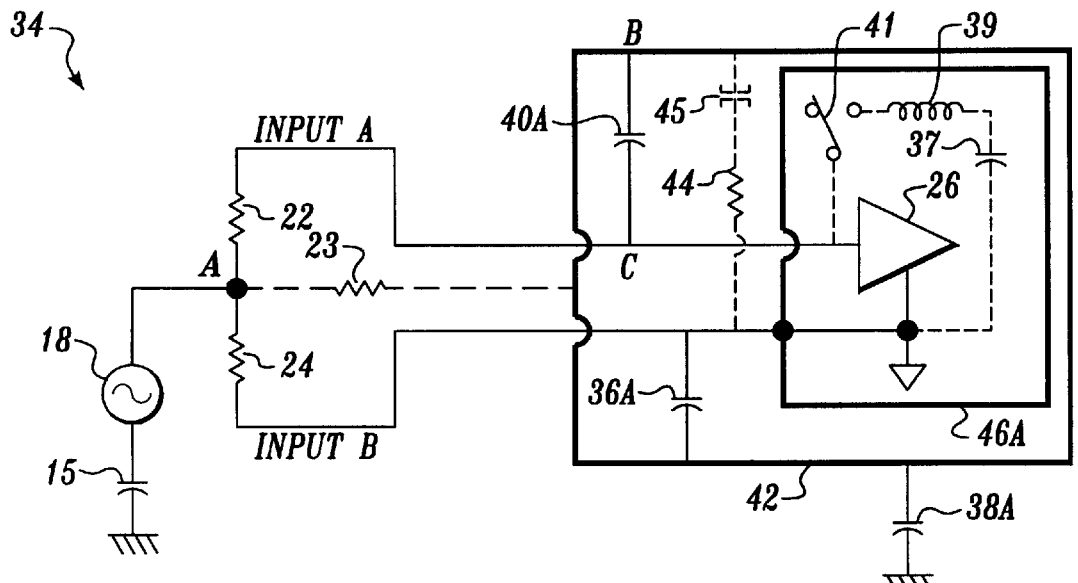
FIG. 2A shows complete inner and outer shields with the parasitic capacitance between the shields and the discrete capacitor added to match the parasitic capacitance.
Figure 2B:
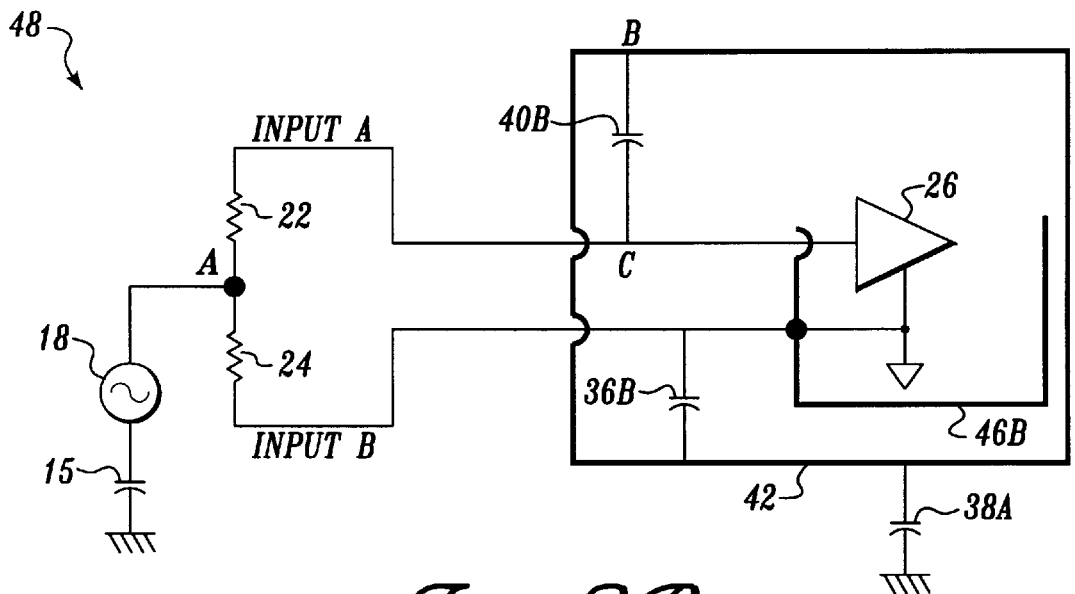
FIG. 2B is similar to FIG. 2A, but illustrates that the inner shield does not need to completely enclose the circuitry—such as would be the case for a ground plane—if circuit noise emissions and sensitivity in this configuration are at acceptable levels.

FIGS. 2A and 2B represent embodiments that work on the principle of matching a discrete capacitor to the parasitic capacitance formed between the shield and either the ground plane or an internal shield. In FIG. 2A, a schematic overview 34 is provided of a solid "outer" shield 42 enclosing an "internal" solid shield 46A which in turn encloses the amplifier 26. An end of the noise source 18 is coupled to a capacitor 15 that represents a parasitic capacitance between earth ground and the noise source. Another end of the noise source 18 is coupled at Terminal A in parallel to an end of a resistive lead (represented by the resistor 22) and an end of the another resistive lead (represented by the resistor 24). Another end of the resistor 22 is coupled to the input of the amplifier 26 and another end of the resistor 24 is coupled to the reference of the amplifier which is also circuit ground. Additionally, a small signal for amplification is provided by a small signal source (not shown) inserted between resistors 22 and 24.

A solid outer shield 42 manufactured from a conductive material encloses the solid inner shield 46A and amplifier 26. A capacitor 36A is coupled between the solid inner shield 46A and the solid outer shield 42 and it represents the inner shield to outer shield parasitic capacitance. A capacitor 38A is coupled between the solid outer shield 42 and earth ground and it represents the solid outer shield to earth ground parasitic capacitance. A discrete capacitor 40A is connected between the solid outer shield 42 (at Terminal B) and the input (at Terminal C) of the amplifier 26. The value (Farads) of the capacitor 40A is selected to match the parasitic capacitance formed by the proximity of the inner shield 46A and outer shield 42 as represented by the capacitor 36A so that a balanced impedance to common mode signals is present on all inputs (including the reference input) of the amplifier 26. In this way, the present invention provides a relatively balanced impedance between the inputs to the amplifier 26 and any return path for the common mode current. Also, the capacitor 40A is rated for the maximum voltage applied to the circuit under all conditions, e.g., a high voltage circuit switched into the circuitry of the present invention may require the capacitor 40A to be rated for upwards of 5,000 Volts. While not shown, it is appreciated that the amplifier circuit 26 inside of the inner shield 46A can be replaced with other electronic circuits, e.g., an A/D converter can use the present invention to reduce the effect of external noise sources on sampled input signals.

Although not shown, instead of employing a matching capacitor 40A to compensate for the unbalanced parasitic capacitance, it is envisioned that a matching resistor could be coupled between the outer shield 42 and the inner shield 46A. In another embodiment, a matching resistor (not shown) could be connected in series with the matching capacitor 40A between the outer shield 42 and the inner shield 46A.

In this case, if the matching capacitor 40A has failed in a closed position, the matching resistor will continue balancing the impedance to common mode signals, albeit at a reduced performance compared to that achieved with the matching capacitor.

It is envisioned that a high voltage circuit such as a defibrillator circuit may be employed with the present invention. An optional defibrillator circuit is shown in dotted lines to be enclosed within the solid inner shield 46A and to include a high voltage discharge capacitor 37 coupled between circuit ground and an inductance 39. In dotted lines, a switch 41 is illustrated for optionally connecting the capacitor 37 and inductance 39 to the input connected to resistor 22 for the purposes of defibrillation In this way, the amplifier 26 may sense a small signal at Terminal A, e.g., an electrocardiogram signal, until it is determined to employ the switch 41 to discharge a waveform from the defibrillation circuit through the resistive leads (resistors 22 and 24) to a patient. The resistors 22 and 24 represent the source resistances present in a patient and as such are part of the patient or at least a combination of the patient and a pair of electrodes coupled to the patient through the resistive leads.

Optionally, a surge protector 45 (shown in dotted relief) and a resistor 44 (shown in dotted relief) or a surge protector 45 alone may be coupled in series between the outer shield 42 and the inner shield 46A which is connected to circuit ground when the shields cannot be electrically isolated to the voltage levels present in the circuit. The surge protector 45 and the resistor 44 have no effect on the CMRR or any capacitance in the circuit. Instead, they play a role in the circuit when there is a voltage surge. For example, when the invention is used in a device such as a defibrillator, the shield could be potentially charged up to a high voltage of 5,000 Volts or more. The use of the surge protector 45 and the resistor 44 could clamp the voltage on the shield to something on the order of 100 Volts during the discharge of the defibrillator. The value (Ohms) of the resistor 44 is selected to limit the amount of in-rush current that can flow through the surge protector. In one embodiment, the surge protector 45 may be a "gas gap" device rated for a maximum of 90 Volts and the resistor 44 may have a value of 4,000 ohms. In this embodiment, the solid outer shield 42 only has to be constructed to withstand maximum voltages somewhat higher than the rating of the surge protector 45, e.g., 90 Volts, instead of the voltage rating of the high voltage circuit which can be as high as 5,000 Volts. Additionally, although not shown in the figures discussed below, the resistor 44 and the surge protector 45 may also be coupled in series between the circuit ground and a (solid or grid) shield disposed in any of the configurations presented below.

In yet another embodiment, another connection can be made between the solid outer shield 42 and Terminal A via series resistor 23 (shown in dashed lines). This connection provides a much lower impedance path for the common mode noise current since this current does not have to flow through capacitors 36A and 40A. This effectively shunts the common mode noise current away from resistors 22 and 24 resulting in a much smaller voltage drop across these resistors and thus lessens the possibility of common mode to differential mode conversion.

Additionally, the connecting medium between the signal source and the electronic circuitry can be shielded, such as by using shielded cable. In this case, the shield from each cable coming from the source should be connected to the outer shield.

Turning to FIG. 2B, a schematic overview 48 illustrates a solid shield enclosing an amplification circuit generally comparable to the circuit shown in FIG. 2A. Except, in this case, the internal solid shield 46B is envisioned to be a ground plane and thus not totally enclose amplifier 26. A discrete capacitor 40B is coupled between the outer shield 42 and the non-reference input of amplifier 26. The value (Farads) of the capacitor 40B is selected to match the parasitic capacitance formed by the proximity of the inner shield 46B and outer shield 42 as represented by the capacitor 36B so that a balanced impedance to common mode signals is present on all inputs (including the reference input) of the amplifier 26. In this way, the present invention provides a relatively balanced impedance between the inputs to the amplifier 26 and any return path for the common mode current.

Figure 3:
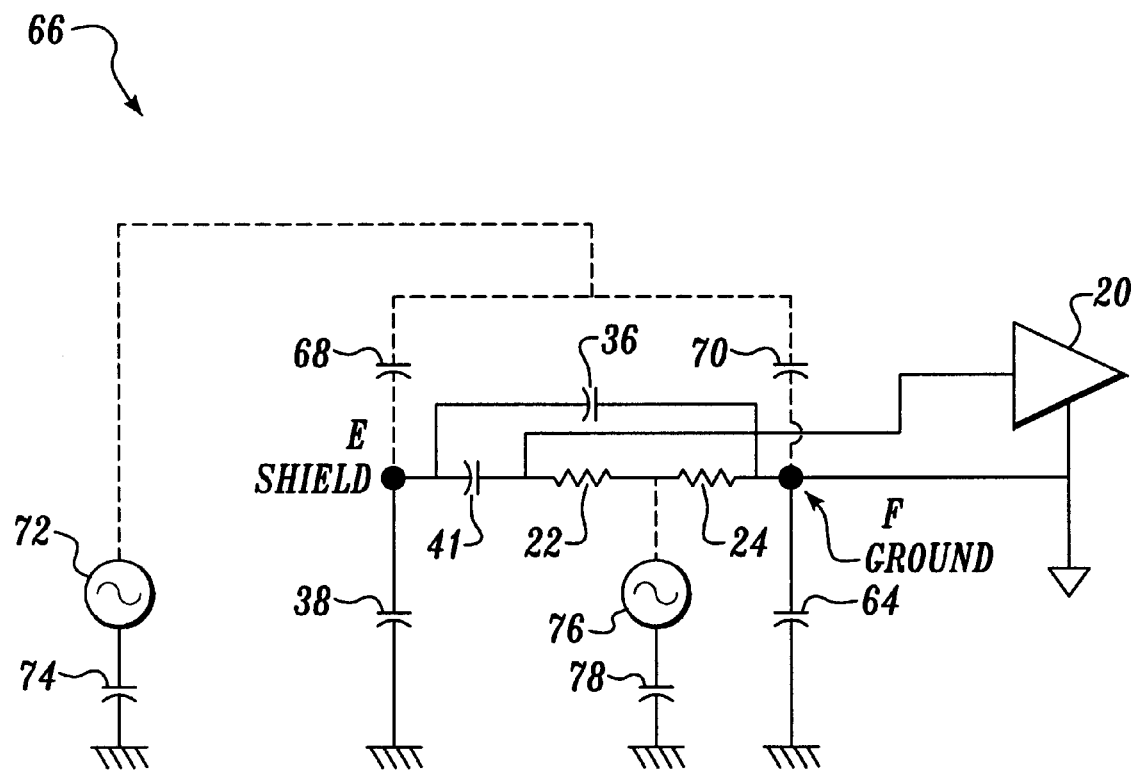
FIG. 3 is a schematic model of the operation of the small signal amplification circuit with a grid or coarse mesh shield.

FIG. 3 is a representation of the discrete components and parasitic capacitances in an amplifier circuit 66 that employs a non-solid, i.e., grid, shield for use with an electronic circuit such as a defibrillator. Common mode noise can be introduced into the loop at any point; two common sources are from an operator and/or a patient connected to the electronic circuit. One end of an operator noise source 72 is coupled by a parasitic capacitance 74 to earth ground and another end of the operator noise source is coupled in parallel to an end of a capacitor 68 (operator-to-shield parasitic capacitance) and an end of a capacitor 70 (operator-to-circuit ground parasitic capacitance). The other end of the capacitor 68 is coupled to a non-solid shield at Terminal E and the other end of the capacitor 70 is coupled to the circuit ground at Terminal F. The connections between the operator noise source 72, capacitor 68, capacitor 70, the non-solid shield and the circuit ground are shown in dotted lines to indicate that these components are present when an operator is using (close to or touching) devices associated with the circuit.

An end of a capacitor 38 (shield-to-earth ground parasitic capacitance) is coupled to earth ground and another end is coupled to the non-solid shield at Terminal E. An end of a capacitor 36 (shield to circuit ground plane parasitic capacitance) is coupled to Terminal E (non-solid shield) and the other end is coupled to circuit ground at Terminal F. An end of a discrete (shield-to-amplifier) capacitor 41 is coupled to Terminal E (shield) and another end is coupled to the non-reference input of the amplifier 20 and an end of the resistor 22. The other end of the resistor 22 is coupled to an end of the resistor 24 and an end of a patient noise source 76. The other end of the resistor 24 is coupled to circuit ground at Terminal F. Also, the other end of the patient noise source 76 is coupled to an end of a capacitor 78 (patient to earth parasitic capacitance). The other end of the capacitor 78 is coupled to earth ground.

Additionally, an end of a capacitor 64 (circuit ground plane to earth ground parasitic capacitance) is coupled to Terminal F (circuit ground) and the other end is coupled to earth ground.

The use of a non-solid shield raises several considerations that are different than the use of a solid (complete) shield for a defibrillator as discussed above. By ignoring the effect of an operator (operator noise source 72 and capacitors 68, 70, and 74) the current flowing through the resistors 22 and 24 from the patient noise source 76 must be balanced for both resistors. This means that the impedance seen by the patient noise source 76 back to earth must be the same on the other ends of the resistors 22 and 24. To balance this impedance without the use of discrete capacitor 41, the value of the capacitor 38 (shield to earth ground parasitic capacitance) must equal the value of the capacitor 64 (circuit ground to earth ground parasitic capacitance). In cases where it is difficult to match capacitors 38 and 64, discrete capacitor 41 may be added in series with capacitor 38 such that the series combination of capacitors 38 and 41 equals the value of capacitor 64.

Second, when the effects of the operator are considered (operator noise source 72 and capacitors 68 and 70), the ratio of the values of the capacitor 68 over the capacitor 38 must be equal to the ratio of the values of the capacitor 70 over the capacitor 64. By making these ratios equal to each other, the voltage generated by the operator noise source 72 at the inputs to the amplifier will be the same. Since the value of the discrete shield-to-amplifier capacitor 41 is selected to be larger than the other parasitic capacitors, there is a relatively small voltage drop across the discrete capacitor 41 and the balancing of the ratios will result in relatively balanced voltages at the inputs to amplifier 20. There are two voltage dividers, one on each side of the "H-Bridge" circuit, and while the impedances in each leg do not have to be equal, the ratios from top to bottom do have to be equal to balance the bridge. Also, since the shield-to-circuit ground parasitic capacitance (capacitor 36) is not significant in the non-solid shield embodiment, the discrete shield-to-amplifier capacitor 41 is not chosen to match the value of the capacitor 36.

Figure 4A:
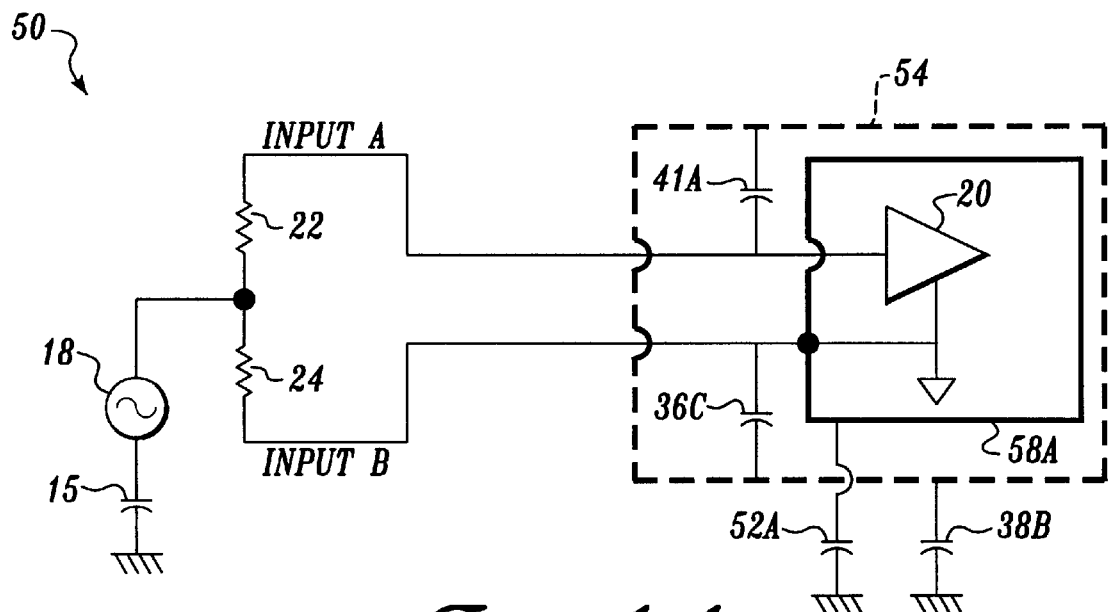
FIG. 4A shows the grid outer shield with a complete inner shield along with the parasitic and discrete capacitors that are formed or added for this embodiment of the invention.
Figure 4B:
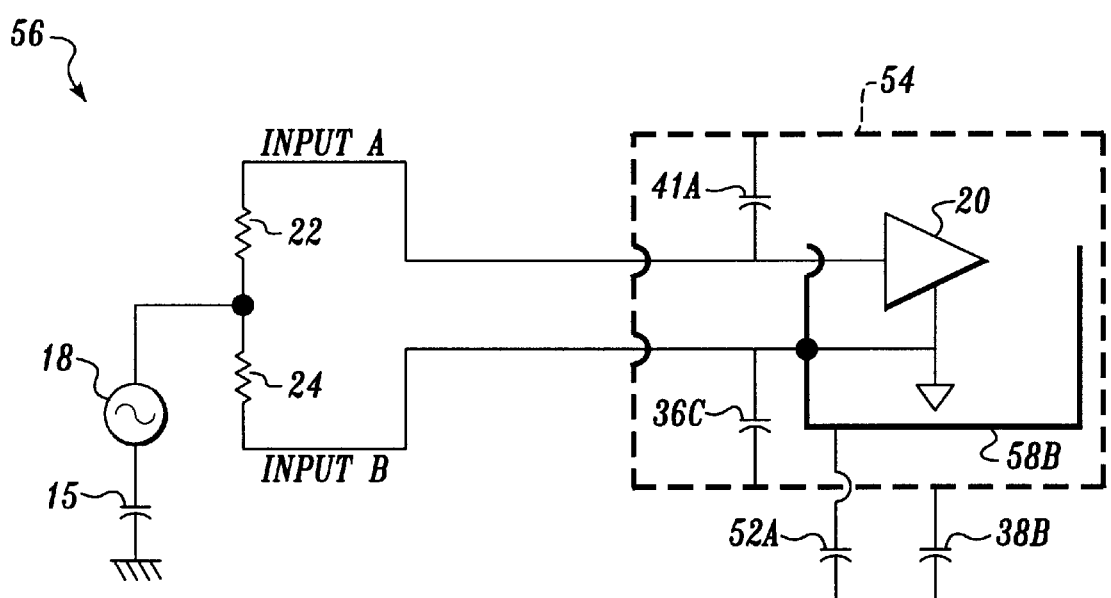
FIG. 4B is similar to FIG. 4A, but illustrates that the inner shield does not need to completely enclose the circuitry—such as would be the case for a ground plane—if circuit noise emissions and sensitivity in this configuration are at acceptable levels.

FIGS. 4A and 4B illustrate grid shield embodiments that function in a fashion different than the embodiments shown in FIGS. 2A and 2B. In FIG. 4A, a schematic overview 50 shows a grid "outer" shield 54 enclosing an "internal" solid shield 58A which in turn encloses the amplifier 20. An end of the noise source 18 is coupled by a capacitor 15 (noise source-to-earth ground parasitic capacitance). Another end of the noise source is coupled at Terminal A in parallel to an end of a resistive lead (represented by the resistor 22) and an end of the another resistive lead (represented by the resistor 24). Another end of the resistor 22 is coupled to the non-reference input of the amplifier 20 and another end of the resistor 24 is coupled to circuit ground which also is the reference input of the amplifier. Additionally, a small signal source 16 is coupled in series at Terminal A (not shown) between the ends of the resistors 22 and 24 and this source provides a small signal for amplification.

A grid shield 54 manufactured from a conductive material encloses the solid inner shield 58A which in turn encloses amplifier 20. A capacitor 36C (outer grid shield to solid inner shield parasitic capacitance) is coupled between the solid inner shield 58A and the outer grid shield 54. A capacitor 38B (grid shield to earth ground parasitic capacitance) is coupled between the grid shield and earth ground. Also, a capacitor 52A (solid inner shield to earth ground parasitic capacitance) is coupled between the solid inner shield and earth ground.

A discrete capacitor 41A is connected between the grid shield 54 and the non-reference input to the amplifier 20. The grid shield is selected and positioned so that the overall ratios of capacitances are balanced as discussed above in the description of FIG. 3. Thus, a relatively balanced impedance is provided between the inputs to the amplifier and any return path for the common mode current.

The fineness of the spacing in the grid shield 54 is preferably selected to be less than the relative "pointiness" from an applied electric field of a noise source, e.g., a finger of a user. In this way, the parasitic capacitance created by the proximity of the finger in relation to the grid shield is balanced by the parasitic capacitance created between the finger and the amplification circuit components including the circuit ground plane. The spacing of the grid shield may be sized so that an electric field surrounding a finger will impinge on multiple spaces in the grid shield.

Also, the thinness of the wire forming the grid shield 54 is preferably selected to enable the amplification circuit components to be "seen" by the electric field surrounding the finger of the user. For example, a grid shield disposed far away from the amplification circuit could employ a thinner wire than a grid shield positioned in close proximity to the circuit. In this way, the larger "holes" in the grid shield produced by the thinner wire will reduce a misbalance in the parasitic capacitances created between the finger and the external grid and between the finger and the amplification circuit components. Also, the coarseness of the grid shield may be selected to accommodate the positioning of a battery as long as the overall ratio of capacitances is kept balanced.

In FIG. 4B, a schematic 56 shows a pair of shields enclosing an amplification circuit generally comparable to the circuit shown in FIG. 4A. Except, in this case, the internal solid shield 58B is envisioned to be a ground plane and thus not totally enclose amplifier 26. A discrete capacitor 41A is coupled between the grid shield 54 and the non-reference input of the amplifier 20. The grid shield is selected and positioned so that the overall ratio of capacitances is balanced as discussed above. Thus, a relatively balanced impedance is provided between the inputs to the amplifier and any return path for the common mode current.

Figure 5A:
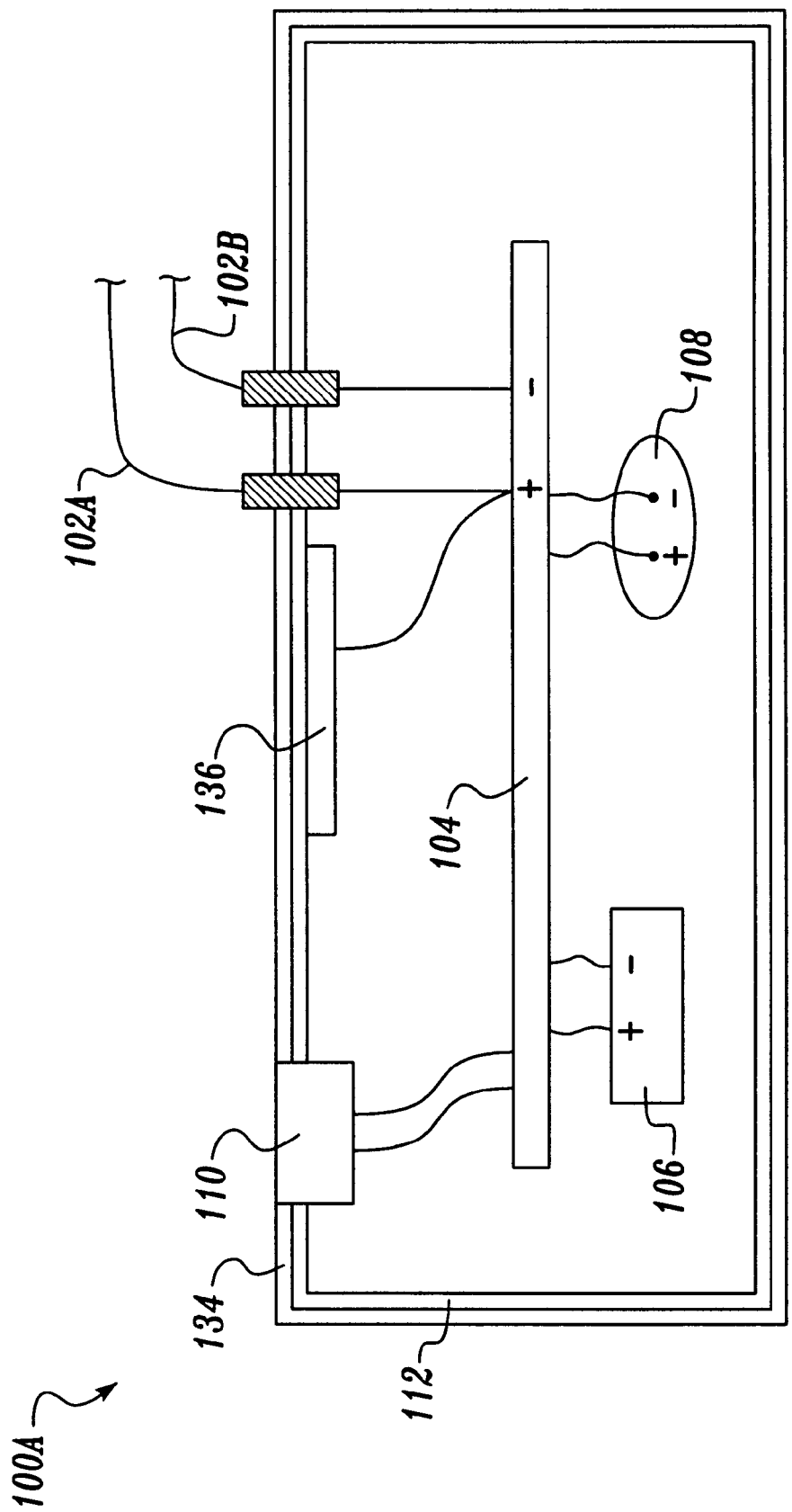
FIG. 5A is a side cross-sectional view showing a defibrillator with an external solid shield that encloses the case of the defibrillator and a capacitive element that is coupled between the external shield and the signal input of the circuit board.

FIGS. 5A–5E illustrate different configurations of the present invention employed with a high voltage defibrillation device. In FIG. 5A, a side cross-sectional view of a defibrillator 100A is shown having a case 112 that is typically manufactured from a non-conductive material. A circuit board 104 is positioned within the case 112. A control 110, a pair of electrodes 102A and 102B, the power supply 106 and the discharge capacitor 108 are coupled to the circuit board 104. An "outer" shield 134 encloses the outside of case 112 of the defibrillator 100A and the components disposed inside the case, i.e., the circuit board 104, the power supply 106 and the capacitor 108. A capacitive element 136 is formed by placing a conductive planar sheet against the inside of case 112 and coupled to the non-reference input of an amplification circuit on the circuit board 104. The position and size of the capacitive element would be selected to match the parasitic capacitance between the solid outer shield and a solid internal shield or optionally, the circuit ground plane.

Figure 5B:
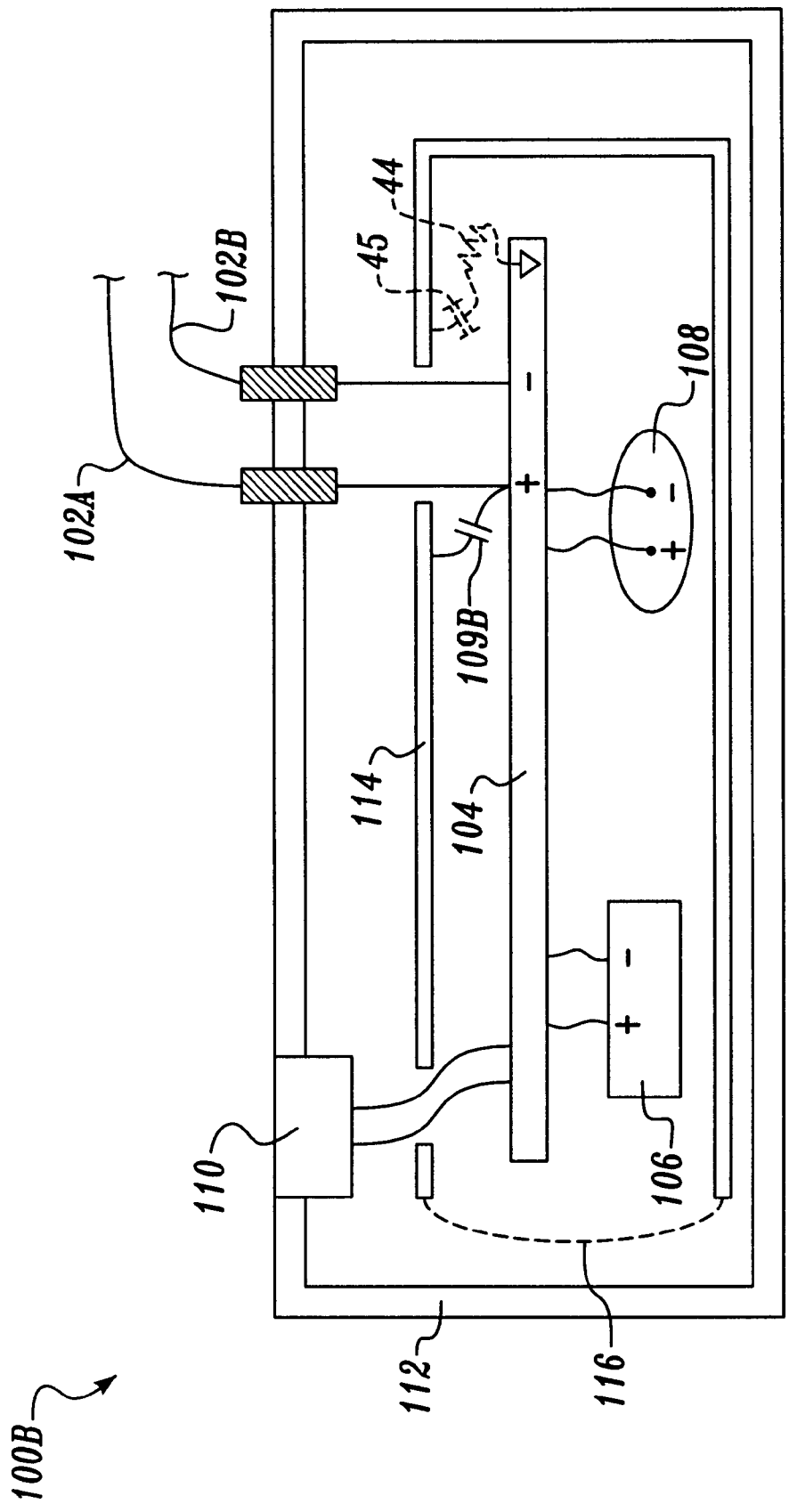
FIG. 5B is a side cross-sectional view showing a defibrillator with a U-shaped internal shield that partially encloses a circuit board, power supply and a discharge capacitor.

In FIG. 5B, a side cross-sectional view of a defibrillator 100B is shown having a case 112 that is typically manufactured from a non-conductive material. A circuit board 104 is positioned within the case 112. A control 110, a pair of electrodes 102A and 102B, the power supply 106 and the discharge capacitor 108 are coupled to the circuit board 104. A capacitor 109B is coupled between the shield 114 and the non-reference input of an amplification circuit on the circuit board 104. For a solid shield, the capacitor 109B is sized to match the parasitic capacitance between the solid shield and the circuit ground plane. However, for a non-solid shield, the value of the capacitor 109B is selected to be significantly larger than the parasitic capacitors in the circuit. Optionally, the surge protector 45 and the resistor 44 (shown in dotted lines) may be connected between the shield 114 and circuit ground to provide substantially the same function as discussed above. Also, a lead 116 (shown as dotted line) may be coupled between the open ends of the U-shaped conductive shield 114.

Figure 5C:
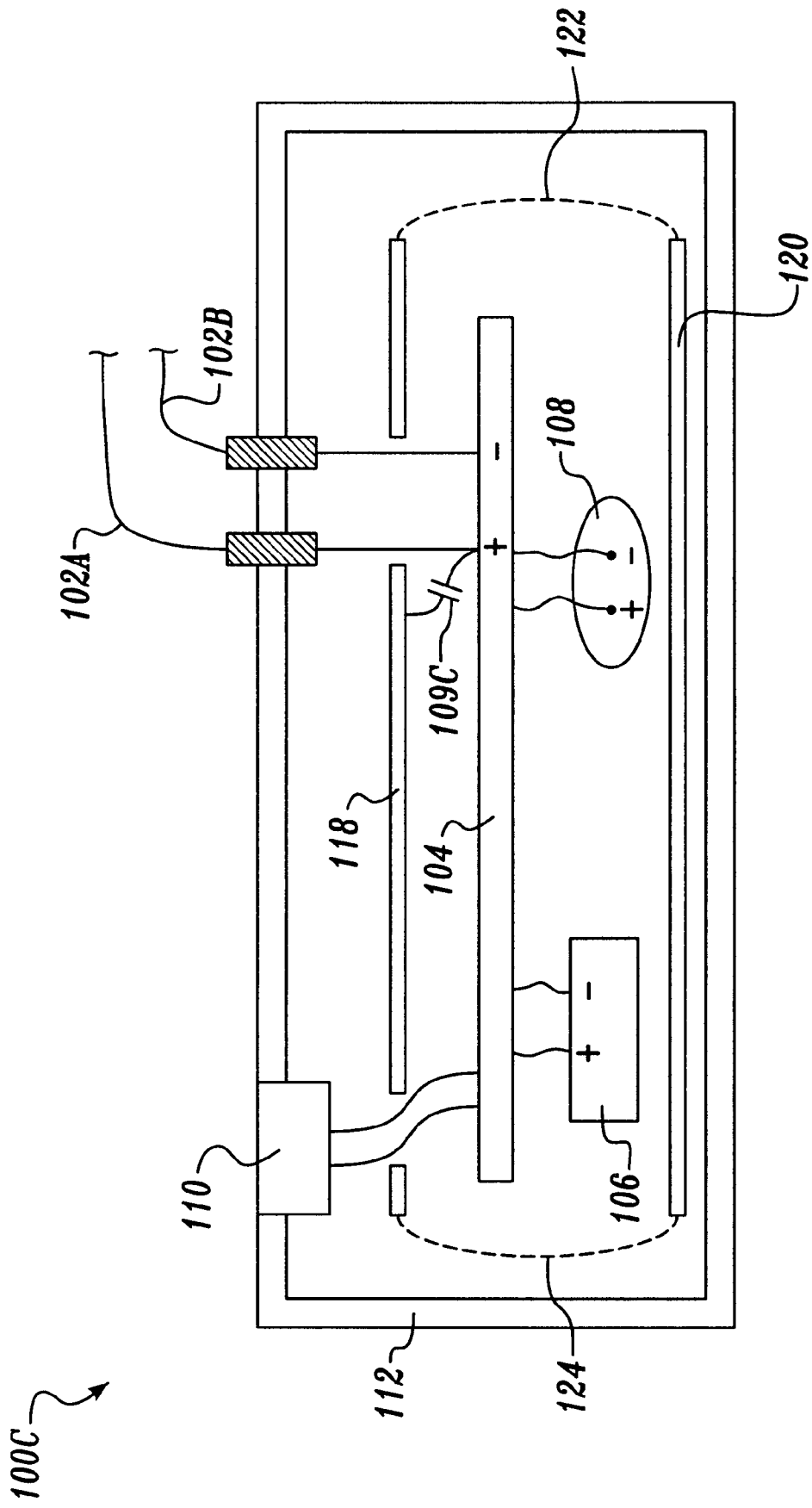
FIG. 5C is a side cross-sectional view illustrating a defibrillator with internal top and bottom planar shaped shields that partially enclose the circuit board, power supply and discharge capacitor, and a capacitor that is coupled between the top shield and the signal input of the circuit board.

FIG. 5C is a side cross-sectional view illustrating a defibrillator 100C that is generally comparable to FIG. 5B except that two substantially planar conductive shields are separately disposed either at the top of the bottom of the case 112. A top shield 118 is positioned between the case 112 and the top of the circuit board 104. Also, a bottom shield 120 is disposed between the case 112 and the bottoms of the power supply 106, discharge capacitor 108 and circuit board 104. At least one of the leads 122 and 124 are coupled between the similarly disposed ends of the top shield 118 and the bottom shield 120. Also, a capacitor 109C is coupled between the shield 118 and the non-reference input of an amplification circuit on the circuit board 104. For solid shields, the capacitor 109C is sized to match the parasitic capacitance between the shield and the circuit ground plane. However, for non-solid shields, the value of the capacitor 109C is selected to be significantly larger than the parasitic capacitors in the circuit.

Figure 5D:
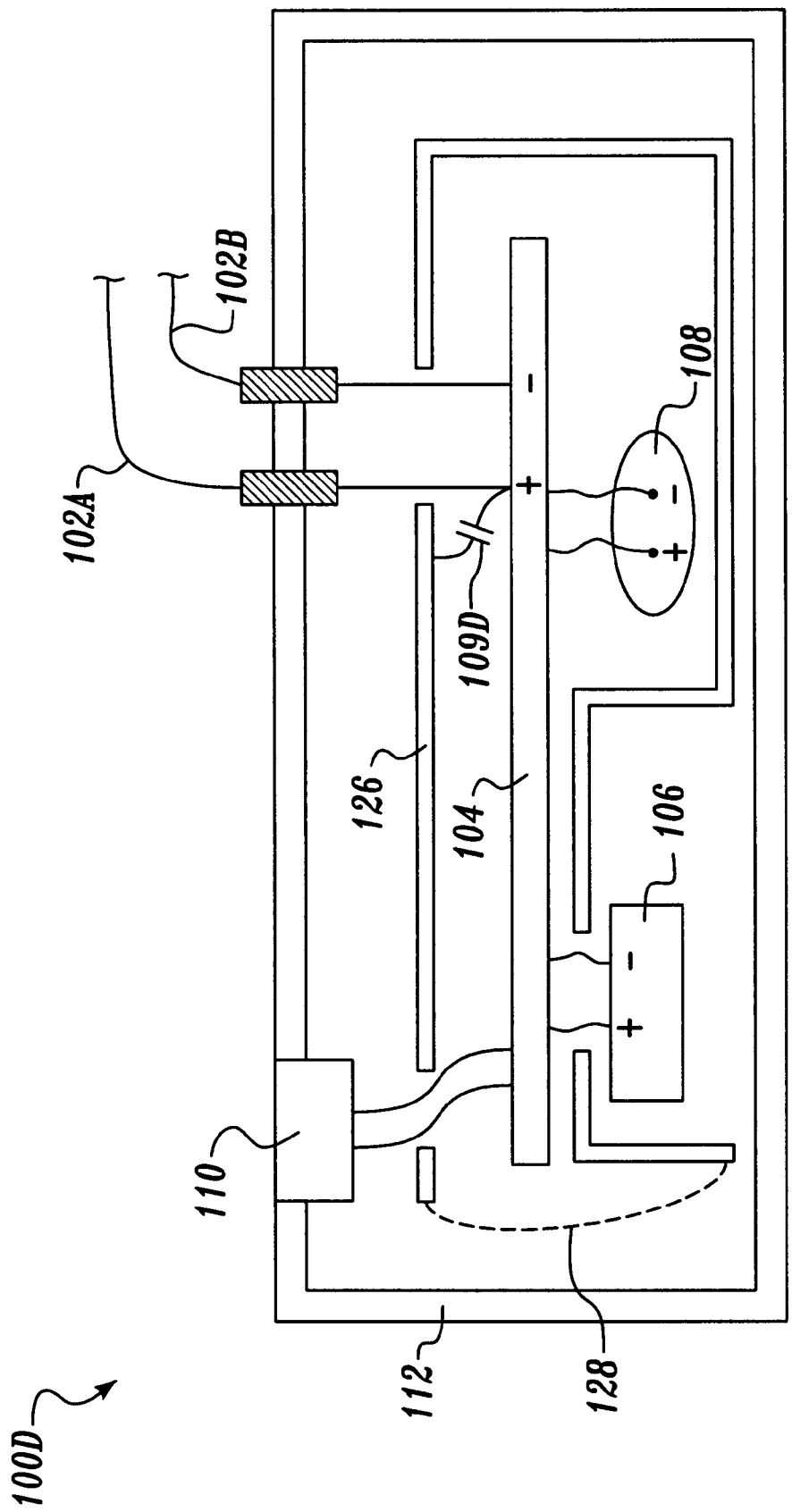
FIG. 5D is a side cross-sectional view showing a defibrillator with a substantially U-shaped internal shield routed around and partially enclosing the circuit board, power supply and discharge capacitor, and a capacitor that is coupled between the shield and the signal input of the circuit board.

FIG. 5D is a side cross-sectional view showing a defibrillator 100D that is generally comparable to FIG. 5B except that a conductive shield 126 with a generally planar surface has been formed into a U-shape that encloses the circuit board 104 and the discharge capacitor 108 and does not enclose the bottom of the power supply 106. A lead 128 may optionally be connected between the open ends of the U-shaped conductive shield 126. Also, a capacitor 109D is coupled between the shield 126 and the non-reference input of an amplification circuit on the circuit board 104. In this embodiment, the conductive shield 126 may be a non-solid (grid) shield that is selected and positioned to operate in the fashion described in the discussion of FIGS. 3 and 4A/B. For a non-solid shield, the value of the capacitor 109D is selected to be significantly larger than the parasitic capacitors in the circuit.

Figure 5E:
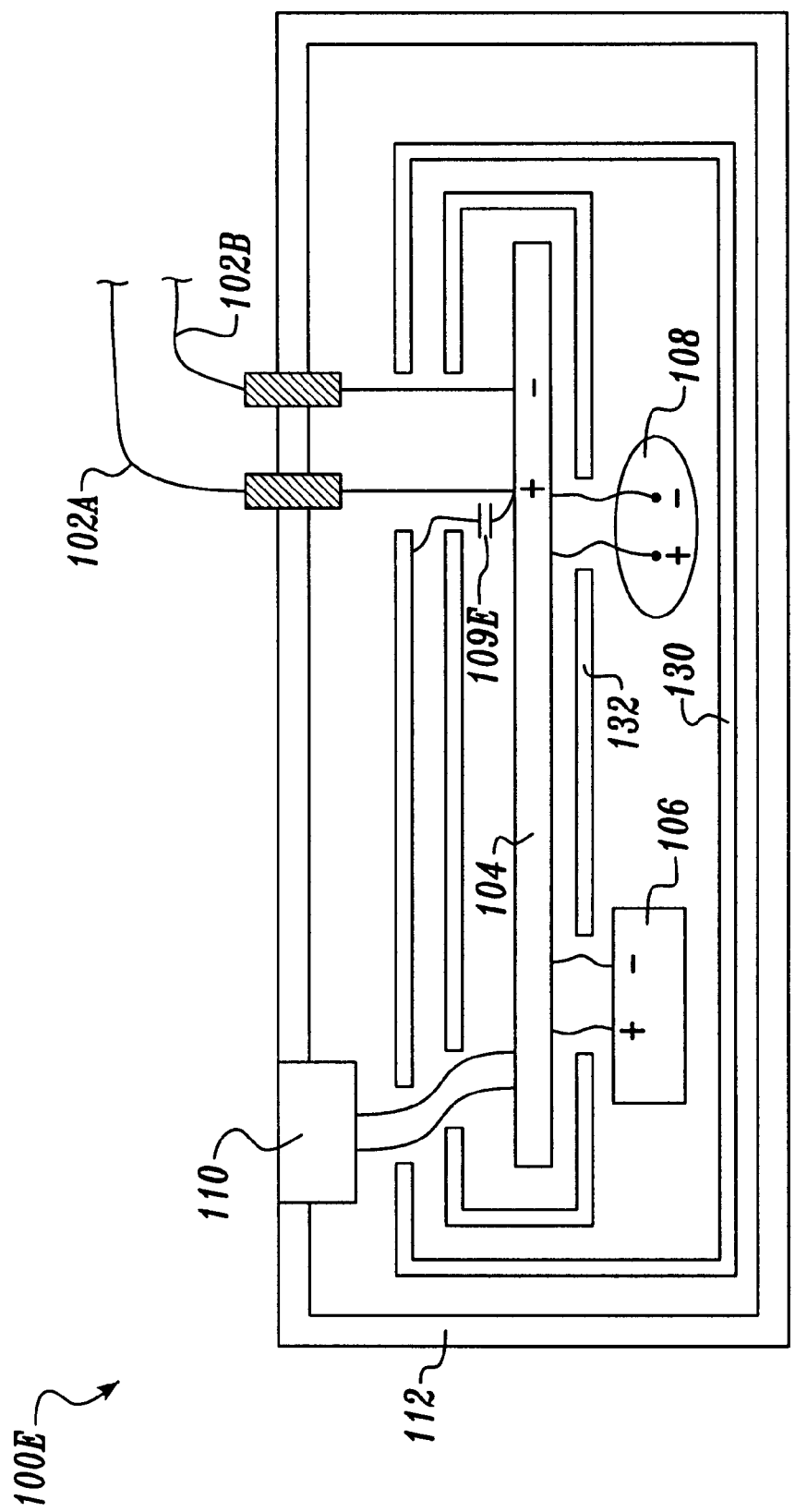
FIG. 5E is a side cross-sectional view illustrating a defibrillator with an internal "inner" shield that encloses the circuit board and an internal "outer" shield that encloses the inner shield, the power supply and the discharge capacitor, and a capacitor that is coupled between the internal "outer" shield and the signal input of the circuit board.

FIG. 5E is a side cross-sectional view illustrating a defibrillator 100E that is generally comparable to FIG. 5B. An inner conductive shield 132 encloses the circuit board 104. An outer conductive shield 130 encloses the power supply 106, the discharge capacitor 108, and the internal shield 132 that houses the circuit board 104. Also, a capacitor 109E is coupled between the external shield 134 and the non-reference input of an amplification circuit on the circuit board 104. When the external shield 130 is a solid shield, the capacitor 109E is sized to match the parasitic capacitance between the solid external shield 130 and the circuit ground plane. However, when external shield 130 is a non-solid (grid) shield, the value of the capacitor 109E is selected to be significantly larger than the parasitic capacitors in the circuit. Also, the non-solid shield 130 is selected and positioned to operate in the fashion described in the discussion above.

An important aspect of the present invention is the virtual elimination of common mode noise for a single ended input to an amplifier by balancing the parasitic capacitance with a matched capacitor and at least one conductive shield. Although some of the embodiments discussed above employ the present invention with an amplifier circuit for a defibrillator, it is envisioned that the present invention may also be used with any type of electronic device that amplifies a small signal, e.g., an electronic instrument that measures small signals and electronic equipment in the telecommunications and audio amplification industries. It is also envisioned that the present invention may be retrofitted to an existing amplification circuit to provide improved CMRR.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. Apparatus for controlling the common mode impedance misbalance of an isolated single ended electronic circuit by controlling an impedance to a common mode current that is present between each signal path in the circuit and all return paths for the common mode current, comprising:

(a) a solid inner shield that encloses at least a portion of the circuit, the solid inner shield being coupled to a circuit ground that is a reference for each signal path in the circuit;

(b) a solid outer shield that encloses at least a portion of the solid inner shield that encloses the circuit; and (c) a capacitor that is coupled between the solid outer shield and a non-reference input of the circuit, the capacitor having a value that is determined in relation to another value of a parasitic capacitor formed between the solid inner shield and the solid outer shield, whereby a desired ratio of impedances from each signal path to all return paths for the common mode current is provided.

2. The apparatus of claim 1, further comprising an electronic device, the circuit being at least one component of the electronic device.

3. The apparatus of claim 2, further comprising an enclosure that encloses the electronic device.

4. The apparatus of claim 3, wherein at least a portion of the solid outer shield is disposed inside the enclosure.

5. The apparatus of claim 3, wherein at least a portion of the solid outer shield is disposed outside the enclosure.

6. The apparatus of claim 1, wherein the solid inner shield is coupled to the ground plane for the circuit.

7. The apparatus of claim 1, wherein the capacitor is a discrete component.

8. The apparatus of claim 7, further comprising a ratio relatively equal to unity for a value of the discrete capacitor over a value for every parasitic capacitance, whereby a balanced impedance is presented to the common mode current.

9. The apparatus of claim 1, wherein the capacitor is formed from another solid shield disposed between the solid outer shield and the solid inner shield, the other solid shield having a size that is relatively smaller than a size of the solid inner shield or a size of the solid outer shield.

10. The apparatus of claim 1, further comprising a plurality of non-reference signal paths in the circuit, a separate capacitor being coupled between the solid outer shield and each non-reference signal path.

11. The apparatus of claim 1, wherein the electronic circuit is an input circuit.

12. The apparatus of claim 1, wherein the electronic circuit is an output circuit.

13. The apparatus of claim 1, wherein the solid outer shield is formed from a mesh material.

14. The apparatus of claim 1, wherein the solid outer shield is formed from an unbroken material.

15. The apparatus of claim 1, wherein the solid inner shield is formed from a mesh material.

16. The apparatus of claim 1, wherein the solid inner shield is formed from an unbroken material.

17. Apparatus for controlling the common mode impedance misbalance of an isolated single ended electronic circuit by controlling the impedances to common mode currents that are present between each signal path in the circuit and all return paths for the common mode current, comprising:

(a) a solid inner shield that encloses at least a portion of the circuit, the solid inner shield being connected to a circuit ground that is a reference for each signal path in the circuit; and (b) a grid outer shield that encloses at least a portion of the solid inner shield, the grid outer shield being connected to a non-reference signal path in the circuit, the size and disposition of the grid outer shield being selected to balance an exposure of the solid inner shield and the grid outer shield to external noise sources.

18. The apparatus of claim 17, further comprising a capacitor coupled between the grid outer shield and the non-reference signal path in the circuit, a value of the capacitor being chosen to control the common mode impedance of the non-reference signal path relative to the common mode impedance of a reference signal path in the circuit.

19. The apparatus of claim 18, wherein the value of the capacitor is chosen to provide equal common mode impedance for the non-reference signal path and the reference signal path.

20. The apparatus of claim 18, wherein the capacitor is a discrete component.

21. The apparatus of claim 18, wherein the capacitor is formed from another solid shield disposed between the grid outer shield and the solid inner shield, the other solid shield having a size that is relatively smaller than a size of the solid inner shield or a size of the grid outer shield.

22. The apparatus of claim 17, further comprising an electronic device, the circuit being at least one component of the electronic device.

23. The apparatus of claim 17, further comprising a ground plane that is coupled to the solid inner shield.

24. The apparatus of claim 17, wherein the circuit is an input circuit.

25. The apparatus of claim 17, wherein the circuit is an output circuit.

26. The apparatus of claim 17, wherein the grid outer shield is formed from a coarse mesh material.

* * * * *